(12) United States Patent
Liao

(10) Patent No.: US 12,051,887 B2
(45) Date of Patent: Jul. 30, 2024

(54) METHOD FOR SOLDERING ELECTRONIC COMPONENT AND METHOD FOR MANUFACTURING LED DISPLAY

(71) Applicant: MICRAFT SYSTEM PLUS CO., LTD., Taoyuan (TW)

(72) Inventor: Chien-Shou Liao, Taichung (TW)

(73) Assignee: MICRAFT SYSTEM PLUS CO., LTD., Taoyuan (TW)

( * ) Notice: Subject to any disclaimer, the term of this patent is extended or adjusted under 35 U.S.C. 154(b) by 0 days.

(21) Appl. No.: 17/984,263

(22) Filed: Nov. 10, 2022

(65) Prior Publication Data
US 2023/0068569 A1  Mar. 2, 2023

Related U.S. Application Data

(63) Continuation of application No. 16/559,728, filed on Sep. 4, 2019, now abandoned.

(30) Foreign Application Priority Data

Mar. 6, 2019 (TW) ................................. 108107398

(51) Int. Cl.
| | |
|---|---|
| *H01S 5/22* | (2006.01) |
| *B23K 1/005* | (2006.01) |
| *F21V 19/00* | (2006.01) |
| *H01L 23/00* | (2006.01) |
| *F21Y 115/10* | (2016.01) |
| *H01L 25/075* | (2006.01) |
| *H01L 33/00* | (2010.01) |
| *H01L 33/06* | (2010.01) |

(52) U.S. Cl.
CPC .......... *H01S 5/2228* (2013.01); *B23K 1/0056* (2013.01); *F21V 19/0015* (2013.01);
(Continued)

(58) Field of Classification Search
CPC ... H01S 5/2228; H01S 5/2216; B23K 1/0056; F21V 19/0015; F21Y 2115/10; H01L 25/0753; H01L 33/0008; H01L 33/06; H01L 2224/16227; H01L 2224/75261; H01L 24/13; H01L 2224/75263; H01L 24/799; H01L 24/98; H01L 2224/131; H01L 2224/75745; H01L 2224/81192; H01L 24/81; H01L 24/06; H01L 33/0095; H01L 33/62; H01L 2224/06102;
(Continued)

(56) References Cited

U.S. PATENT DOCUMENTS

| | | | |
|---|---|---|---|
| 4,657,169 A * | 4/1987 | Dostoomian | ........ B23K 1/0056 228/103 |
| 8,691,598 B1 * | 4/2014 | McWhirter | ........ B23K 26/352 372/38.1 |

(Continued)

*Primary Examiner* — Victor A Mandala

(57) ABSTRACT

A method for soldering electronic components includes providing a circuit substrate; providing a plurality of electronic components; placing the plurality of electronic components onto the circuit substrate; applying a conductor between the plurality of electronic components and the circuit substrate; providing an energy source which projects an energy beam with a first coverage; enlarging the energy beam and projecting the energy beam onto the circuit substrate with a second coverage; and melting the conductor within the second coverage via the energy beam and fixing the corresponding electronic components on the circuit substrate through the melted conductor. Besides, a method for manufacturing a LED display is disclosed.

5 Claims, 13 Drawing Sheets

(52) U.S. Cl.
CPC ............. *H01L 24/16* (2013.01); *H01L 24/75* (2013.01); *H01S 5/2216* (2013.01); *F21Y 2115/10* (2016.08); *H01L 25/0753* (2013.01); *H01L 33/0008* (2013.01); *H01L 33/06* (2013.01); *H01L 2224/16227* (2013.01); *H01L 2224/75261* (2013.01)

(58) Field of Classification Search
CPC ... H01L 2224/75901; H01L 2224/7598; H01L 2224/81224; H01L 2224/97; H01L 2924/12041; H01L 2933/0066; H01L 33/0062; H01L 21/67115; H01L 21/67248; H01L 24/16; H01L 24/75; H01L 2924/014; H01L 2924/00014; H01L 2224/81
See application file for complete search history.

(56) References Cited

U.S. PATENT DOCUMENTS

| | | | | |
|---|---|---|---|---|
| 2004/0190294 | A1* | 9/2004 | Gasquet | H05K 3/3421 219/121.64 |
| 2005/0035102 | A1* | 2/2005 | Amako | B23K 1/0056 219/121.73 |
| 2008/0047939 | A1* | 2/2008 | Hummelt | B23K 26/0838 219/121.64 |
| 2009/0127235 | A1* | 5/2009 | Wei | C08G 59/686 219/121.64 |
| 2011/0101411 | A1* | 5/2011 | Elzinga | H05K 3/3494 362/382 |
| 2012/0266461 | A1* | 10/2012 | Nickut | H05K 3/3494 29/840 |
| 2017/0162552 | A1* | 6/2017 | Thompson | H01L 33/0093 |
| 2017/0215280 | A1* | 7/2017 | Chaji | H05K 13/04 |
| 2017/0236811 | A1* | 8/2017 | Pokhriyal | H01L 33/005 257/91 |
| 2018/0130683 | A1* | 5/2018 | Hendriks | H01L 21/6836 |
| 2018/0366433 | A1* | 12/2018 | Ahn | H01L 25/50 |
| 2019/0058099 | A1* | 2/2019 | Oh | H01L 33/005 |
| 2019/0061053 | A1* | 2/2019 | Yang | B23K 26/244 |
| 2019/0279958 | A1* | 9/2019 | Chen | H01L 24/81 |
| 2020/0286758 | A1* | 9/2020 | Liao | H01L 24/81 |
| 2020/0294879 | A1* | 9/2020 | Liao | H01L 25/0655 |
| 2020/0321310 | A1* | 10/2020 | Kim | B23K 1/0056 |
| 2020/0365573 | A1* | 11/2020 | Zluc | H01L 33/60 |
| 2021/0043552 | A1* | 2/2021 | Liao | H01L 24/95 |
| 2021/0220945 | A1* | 7/2021 | Choi | B23K 1/0056 |
| 2022/0037573 | A1* | 2/2022 | Chaji | H01L 27/1266 |

* cited by examiner

METHOD FOR SOLDERING ELECTRONIC COMPONENT AND METHOD FOR MANUFACTURING LED DISPLAY

CROSS-REFERENCE TO RELATED APPLICATION

This application is a continuation application of U.S. patent application Ser. No. 16/559,728 filed on Sep. 4, 2019, which is the US national phase of Taiwan Patent Application No. 108107398 filed on Mar. 6, 2019. The entire contents of these applications are incorporated herein by reference.

BACKGROUND OF THE INVENTION

1. Field of the Invention

The present disclosure relates to a method for soldering electronic components and a method for manufacturing a LED display, and in particular to a method applying altered energy beam coverage to solder the electronic components and a method using the soldering method to manufacture the LED display.

2. Description of the Related Art

Light-emitting diodes (LED) are widely used nowadays due to their excellent light quality and high luminous efficiency. Generally, in order for a display device using a light-emitting diode as a light-emitting element to have better color performance, a conventional display device adopts a combination of red, green, and blue light-emitting diode chips to form a full color light-emitting diode display device. The full-color light-emitting diode display device can respectively emit three colors of red, green and blue light through three kinds of red, green and blue light-emitting diode chips, so that a full-color light is formed to display relevant information after the mixing of light. However, in the related art, in the process of fixing the LED chip on the circuit substrate, the substrate carrying the LED chip needs to be removed first.

BRIEF SUMMARY OF THE INVENTION

Aspects and advantages of embodiments of the present disclosure will be set forth in part in the following description, or may be learned from the description, or may be learned through practice of the embodiments.

An example aspect of the present disclosure is directed to a method for soldering electronic components. The method includes providing a circuit substrate; providing a plurality of electronic components; placing the plurality of electronic components onto the circuit substrate; applying a conductor between the plurality of electronic components and the circuit substrate; providing an energy source which projects an energy beam with a first coverage; enlarging the energy beam and projecting the energy beam onto the circuit substrate with a second coverage, wherein the second coverage is larger than the first coverage; and melting the conductor within the second coverage via the energy beam and fixing the corresponding electronic components on the circuit substrate through the melted conductor.

In some implementations, the energy source is a laser source.

In some implementations, the energy beam is enlarged by an optical lens.

In some implementations, the electronic components are LED chips.

Another example aspect of the present disclosure is directed to a method for manufacturing a LED display. The method includes using the method for soldering electronic components to solder the LED chips onto the circuit substrate.

The foregoing summary is illustrative only and is not intended to be in any way limiting. In addition to the illustrative aspects, embodiments, and features described above, further aspects, embodiments, and features will become apparent by reference to the figures and the following detailed description.

DETAILED DESCRIPTION OF THE INVENTION

Figure 1:
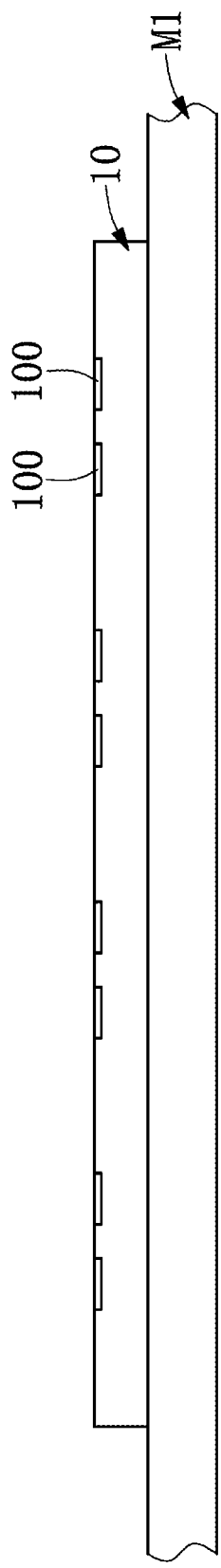
FIG. 1 illustrates a first operational schematic diagram of a laser heating device for soldering electronic components according to some exemplary embodiments.

The aforementioned and other technical features, characteristics and effects of the present disclosure may be clearly presented by the detailed description of exemplary embodiments together with the attached figures. In addition, in the following embodiments, the same or similar components will use the same or similar reference numerals.

In addition, the methods, processes and steps disclosed by the embodiments are only illustrative and not intended to limit. Therefore, a person skilled in the art can appropriately increase, omit, modify or execute each method, process or step alone without departing from the spirit and the scope of the invention, unless the change results in timing or technical inconsistencies. Besides, the orders of each method, process or step can also be altered or adjusted.

Referring to FIG. 1 to FIG. 10, a first embodiment of the present disclosure provides a laser heating device Z for soldering electronic components. The electronic components may be LED chips, and the laser heating device Z includes a carrier substrate M1, an optical module M2 and a laser generation module M3.

Figure 2:
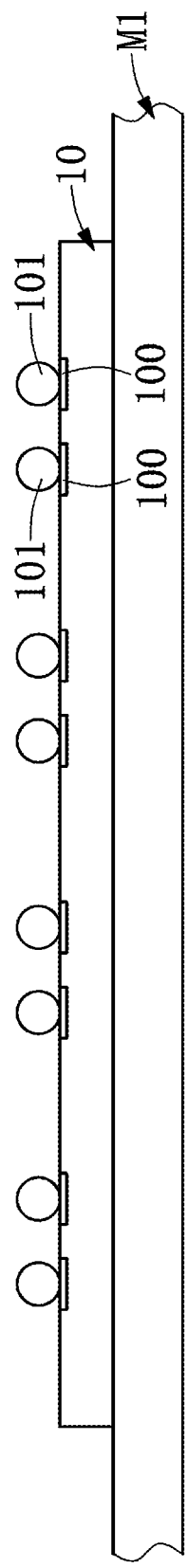
FIG. 2 illustrates second operational schematic diagram of the laser heating device for soldering electronic components according to some exemplary embodiments.

First, as shown in FIG. 1 and FIG. 2, the carrier substrate M1 carries a circuit substrate 10, and the load module M1 may be a stage device with a displacement function. The circuit substrate 10 includes a plurality of conductive pads 100, a plurality of conductors 101 and a plurality of LED chips 102. The conductors 101 are respectively disposed on the conductive pads 100. For example, at least one of the conductors 101 may be disposed on each of the conductive pads 100, and the conductor 101 may be a solder ball or other types of conductive material. The LED chips 102 are disposed on the circuit substrate 10, and each of the LED chips 102 is disposed on at least two conductors 101.

Figure 3:
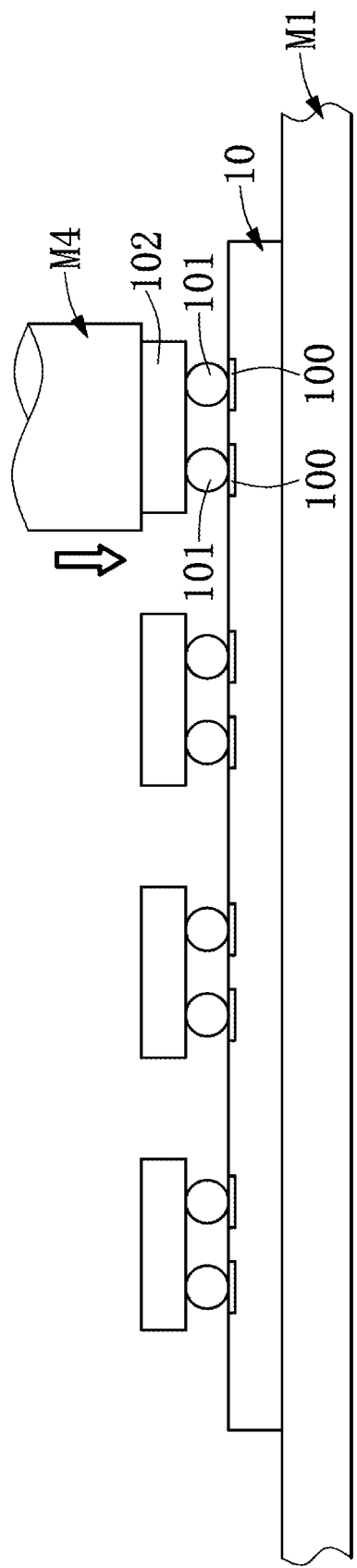
FIG. 3 illustrates a third operational schematic diagram of the laser heating device for soldering electronic components according to some exemplary embodiments.
Figure 4:
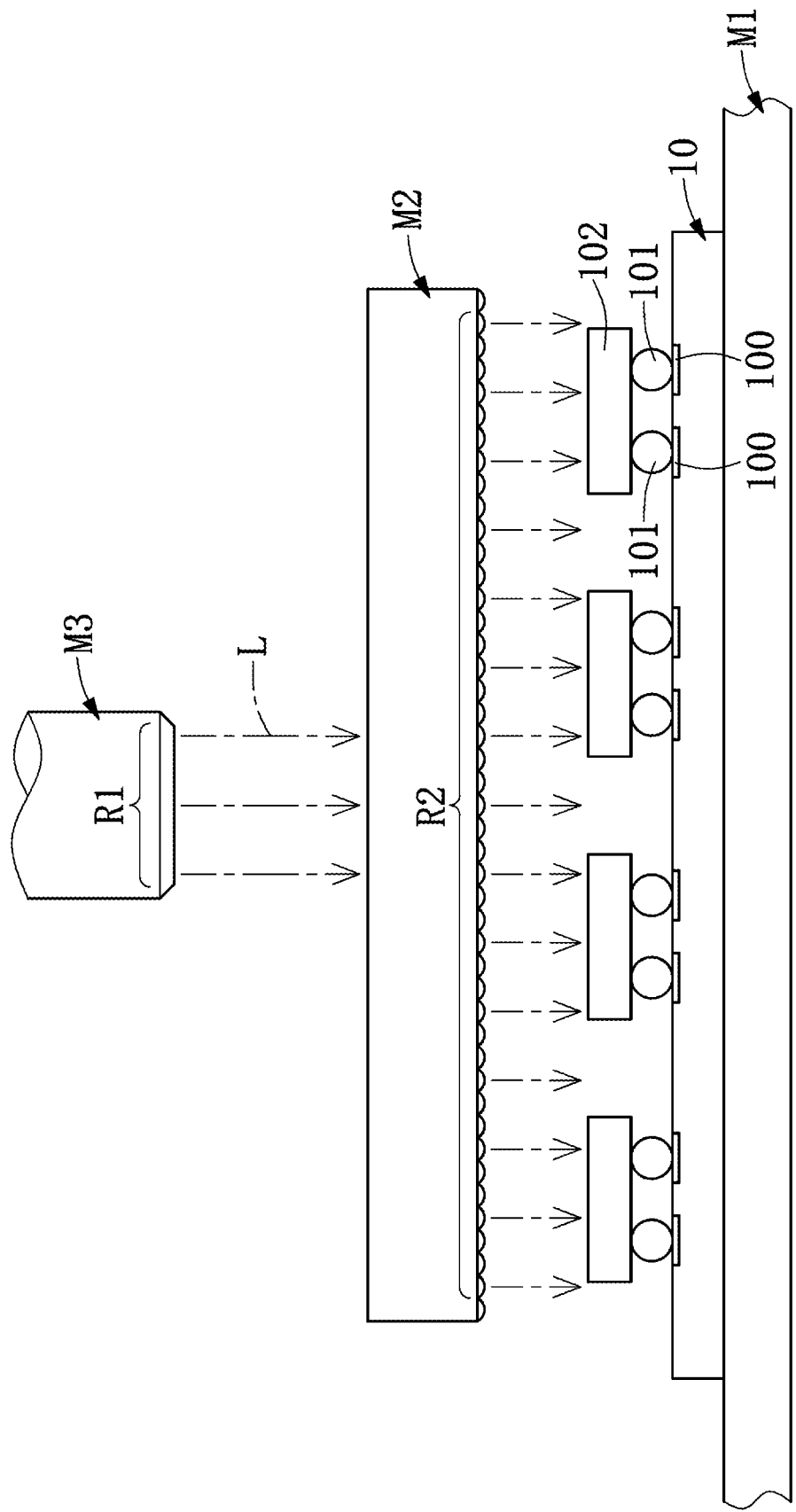
FIG. 4 illustrates a fourth operational schematic diagram of the laser heating device for soldering electronic components according to some exemplary embodiments.
Figure 5:
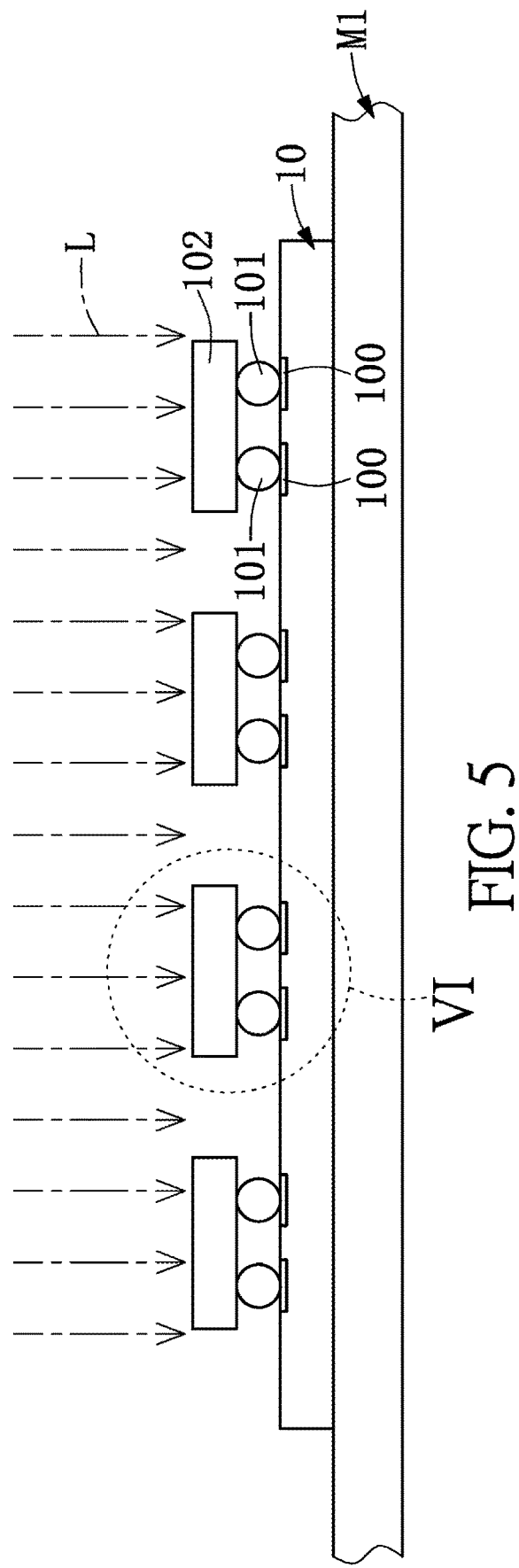
FIG. 5 illustrates a fifth operational schematic diagram of the laser heating device for soldering electronic components according to some exemplary embodiments.

Further, as shown in FIG. 3, the laser heating device Z for soldering electronic components further includes a pick and place module M4 adjacent to the carrier substrate M1. The pick and place module M4 is for placing each of the LED chips 102 on the corresponding conductors 101. For example, a plurality of LED chips 102 may be also placed on the circuit substrate 10 by the pick and place module M4, and each of the LED chips 102 corresponds to at least two conductors 101. The pick and place module M4 may be a vacuum nozzle or any kind of pick and place machine.

Figure 6:
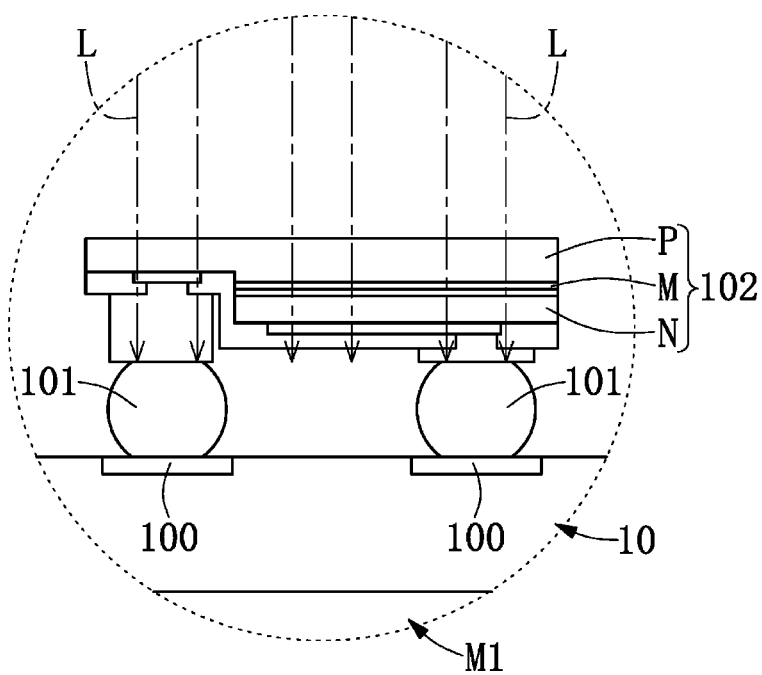
FIG. 6 illustrates an enlarged schematic view of a portion VI of FIG. 5.

The optical module M2 is disposed above the carrier substrate M1 and is located between the laser generation module M3 and the circuit substrate 10. The optical module M2 may be a lens structure or a light guide plate structure. The laser source generating module M3 can provide a laser source L with a first coverage R1 and direct the light from the light source to the optical module M2. The first coverage R1 of the laser source L is formed by the optical adjustment of the optical module M2 to form a second coverage R2. The first coverage R1 may be greater than, less than, or equal to the second coverage R2. In the present embodiment, as an example, the first coverage R1 is smaller than the second coverage R2. Besides, the first coverage R1 and the second coverage R2 may have identical or different shapes. Further, as shown in FIG. 4 to FIG. 7, when the light from the laser source L of the second coverage R2 is directed to each of the LED chips 102, the light passes through the n-type conductive layer N, the light-emitting layer M and the p-type conductive of the LED chip 102, so as to project on at least two conductors 101 of the circuit substrate 10. Further, as shown in FIG. 6, each of the LED chips 102 may be a micro-semiconductor light-emitting element (Micro LED) including an n-type conductive layer N disposed in a stack, a light-emitting layer M passed through by the laser source L and a p-type conductive layer P. The n-type conductive layer N may be an n-type gallium nitride material layer or an n-type gallium arsenide material layer. The light-emitting layer M is a multi-quantum well structure layer. The p-type conductive layer P may be a p-type gallium nitride material layer or a p-type gallium arsenide material layer. However, the above-mentioned example is only one of the possible embodiments.

Figure 7:
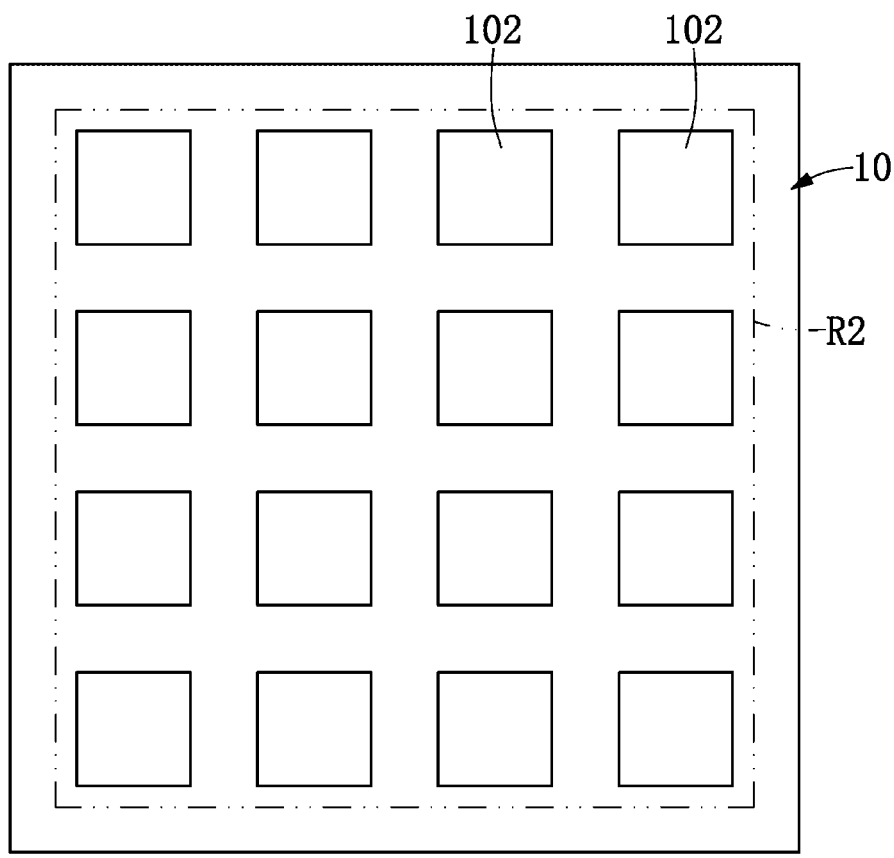
FIG. 7 illustrates a schematic diagram of irradiation of a second coverage of a laser source according to some exemplary embodiments.

Further, as shown in FIG. 7, the second coverage R2 of the laser source L may cover a plurality of LED chips 102. For example, the second coverage R2 may cover 4×4 LED chips 102. Moreover, the intensity 3 of the laser source L of the module M may be adjusted by adjusting the laser source, so that the laser source L3 generated by the laser source generating module M3 passes only through the LED chip 102 without passing through the circuit substrate 10. However, the above-mentioned example is only one of the possible embodiments.

Figure 8:
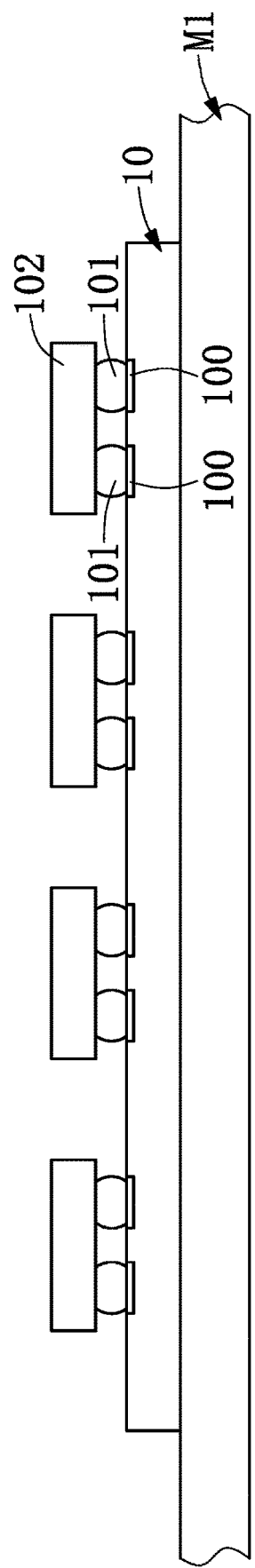
FIG. 8 illustrates a sixth operational schematic diagram of the laser heating device for soldering electronic components according to some exemplary embodiments.

Finally, as shown in FIG. 6 and FIG. 8, the conductor 101 disposed between the LED chip 102 and the circuit substrate 10 is cured by the irradiation of the laser source L, so that the LED chip 102 is mounted onto the circuit substrate 10. For example, when the conductor 101 disposed between the LED chip 102 and the circuit substrate 10 is irradiated by the laser source L, the conductor 101 is softened, and a connection with the LED chip 102 is made. Then, after the conductor 101 is cured, the LED chip 102 is mounted onto the circuit substrate 10 and electrically connected to the circuit substrate 10 through the conductor 101.

Figure 9:
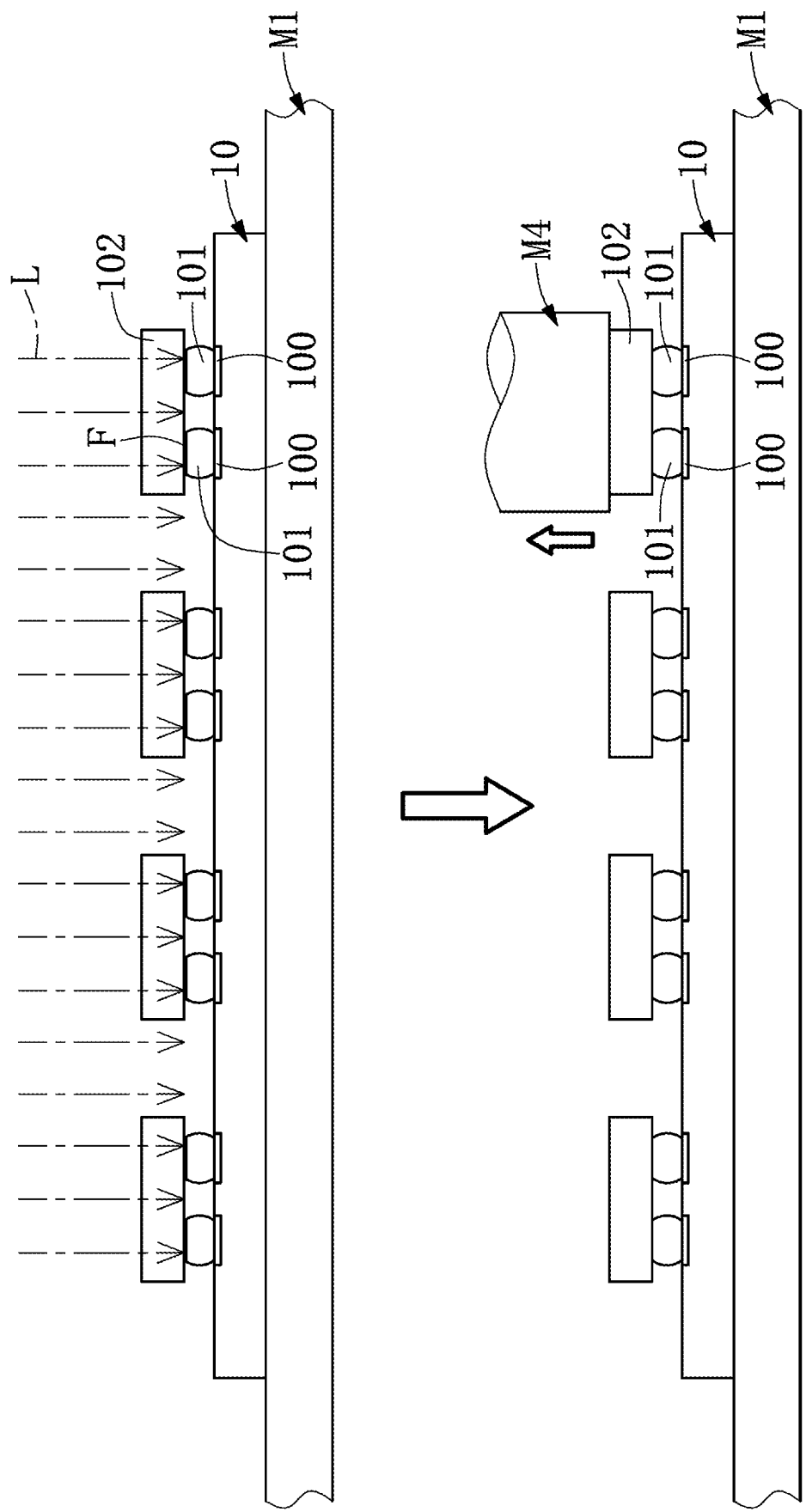
FIG. 9 illustrates a seventh operational schematic diagram of the laser heating device for soldering electronic components according to some exemplary embodiments.
Figure 10:
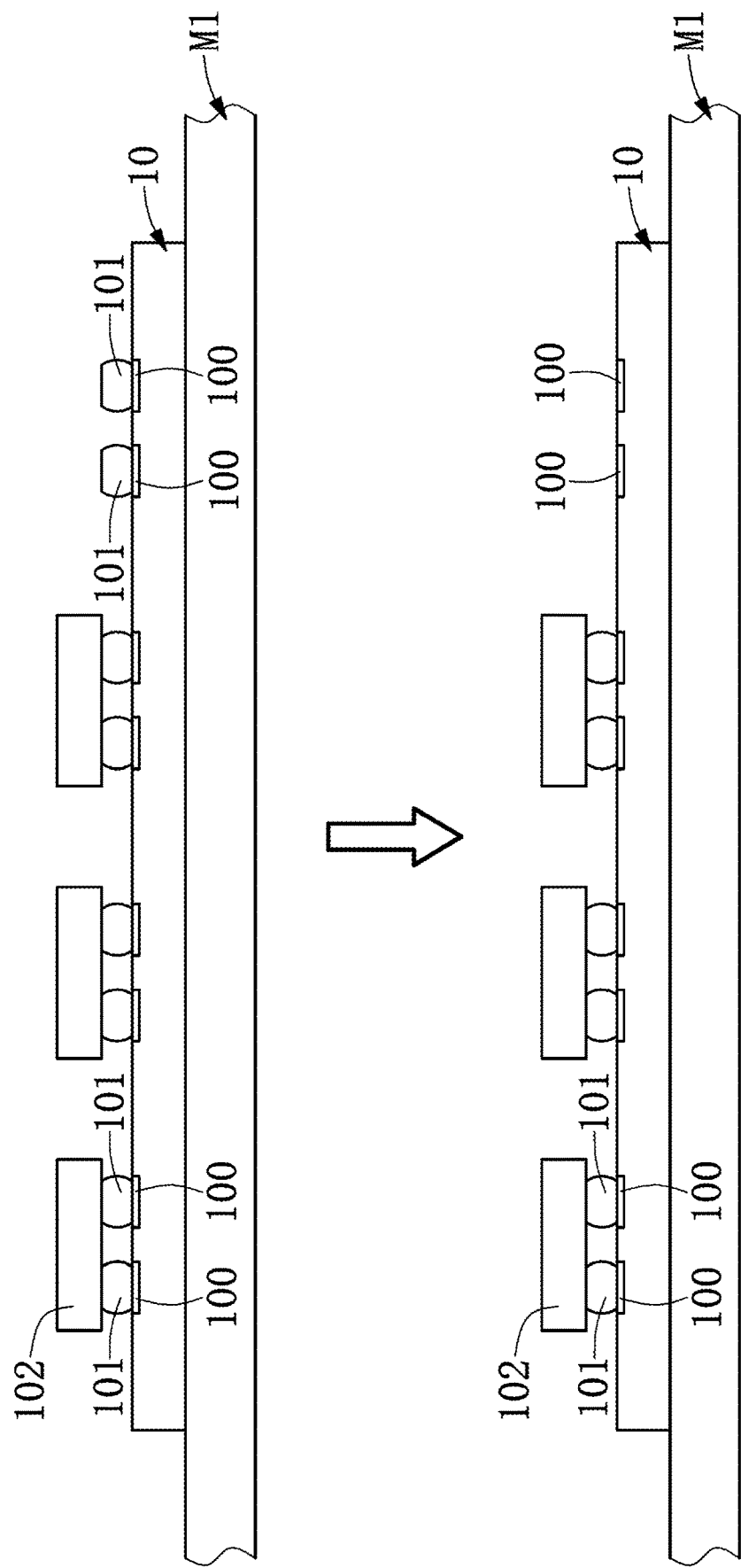
FIG. 10 illustrates an eighth operational schematic diagram of the laser heating device for soldering electronic components according to some exemplary embodiments.

In addition, as shown in FIG. 9 to FIG. 10, the laser heating device Z for soldering electronic components may further project the light from the laser source L generated by the laser source generating module M3 to the contact interface F of the LED chip 102 and the conductor 101, thereby reducing the connection strength between the LED chip 102 and the conductor 101. Thus, the LED chip 102 is removed from the circuit substrate 10 so that the LED chip 102 is easily detached from the conductor 101. For example, the laser source L generated by the laser source generating module M3 may be also directed to the contact interface F between the LED chip 102 and the cured conductor 101 so as to soften part of the conductor 101 close to the contact interface F, and reduce the connection strength and bonding force between the LED chip 102 and the conductor 101, so that the LED chip 102 can be easily detached from the conductor 101 and removed from the circuit substrate 10. Then, at least two old conductors 101 separate from the LED chip 102 can be removed from the circuit substrate 10 using a special instrument such as a scraper or grinder to facilitate repositioning of the new conductor 101.

Further, as shown in FIG. 1 to FIG. 10, a laser heating device Z for soldering electronic components is provided and includes a circuit substrate 10, an optical module M2 and a laser generation module M3. The circuit substrate 10 is used to carry a plurality of conductors 101 and a plurality of LED chips 102. The optical module M2 is disposed above the circuit substrate 10. The laser generation module M3 is adjacent to the optical module M2 to provide a laser source L with a first coverage R1. The conductor 101 is irradiated by the laser source L to fix the LED chip 102, and the first coverage R1 of the laser source L is optically adjusted by the optical module M2 to form a second coverage R2, which is greater than, less than or equal to the second coverage R2.

It should be noted that, in the above-mentioned embodiment, the wavelengths of the laser source L for bonding the conductor 101 to the LED chip 102 and the laser source L for reducing the conductor 11 may be the same as or different from each other.

Figure 11:
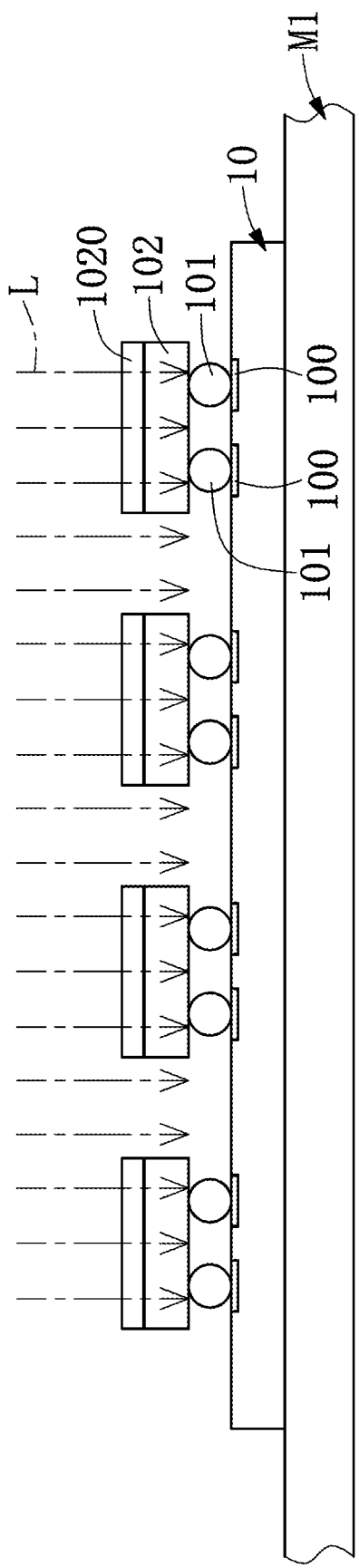
FIG. 11 illustrates a first operational schematic diagram of a laser heating device for soldering electronic components according to some exemplary embodiments.
Figure 12:
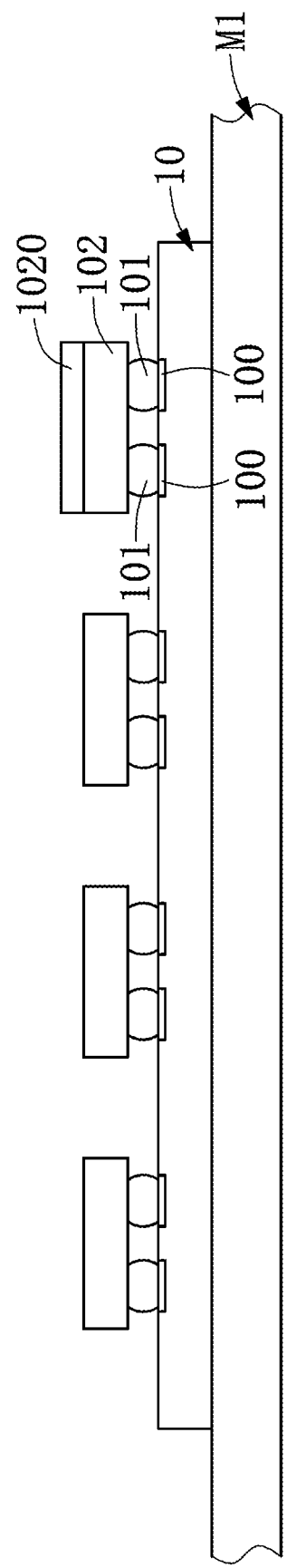
FIG. 12 illustrates a second operational schematic diagram of the laser heating device for soldering electronic components according to some exemplary embodiments.

Referring to FIG. 11 to FIG. 12 together with FIG. 1 to FIG. 10, a second embodiment of the present disclosure provides a laser heating device Z for soldering electronic components. The laser heating device Z for soldering electronic components is similar to that described in the first embodiment, and therefore similar steps in the process will be omitted. Further, with reference to FIG. 6 and according to FIGS. 5, 8, 11 and 12, the difference between the second embodiment and the first embodiment is that each of the LED chips 102 of the present embodiment may be a sub-millimeter light-emitting diode (Mini LED) including a base layer 1020 disposed in a stacked manner, an n-type conductive layer N, a light-emitting layer M passed through by the laser source L and a p-type conductive layer P. The base layer 1020 is a sapphire material layer. The n-type conductive layer N may be an n-type gallium nitride material layer or an n-type gallium arsenide material layer. The light-emitting layer M is a multi-quantum well structure layer. The p-type conductive layer P may be a p-type gallium nitride material layer or a p-type gallium arsenide material layer. The base layer 1020 may also be a quartz base layer, a glass base layer, a tantalum base layer or a base layer of any material. However, the above-mentioned example is only one of the possible embodiments.

For example, when the light from the laser source L of the second coverage R2 is directed to each of the LED chips 102, the light passes through the base layer 1020, the n-type conductive layer N, the light-emitting layer M and the p-type conductive layer P, and the light is projected onto at least two conductors 101 of the circuit substrate 10. Then, the conductor 101 disposed between the LED chip 102 and the circuit substrate 10 is cured by irradiation of the laser source L so that the LED chip 102 is mounted on the circuit substrate 10. However, the above-mentioned example is only one of the possible embodiments.

Figure 13:
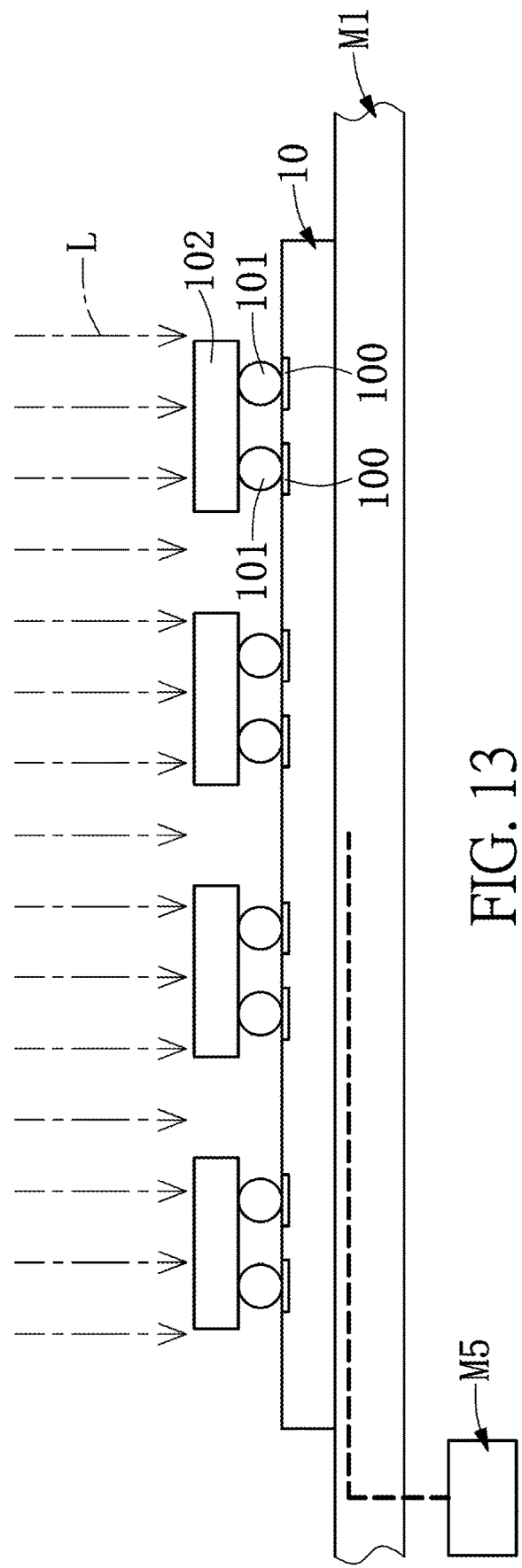
FIG. 13 illustrates a schematic structural view of a partial module of a laser heating device for soldering electronic components according to some exemplary embodiments.
Figure 14:
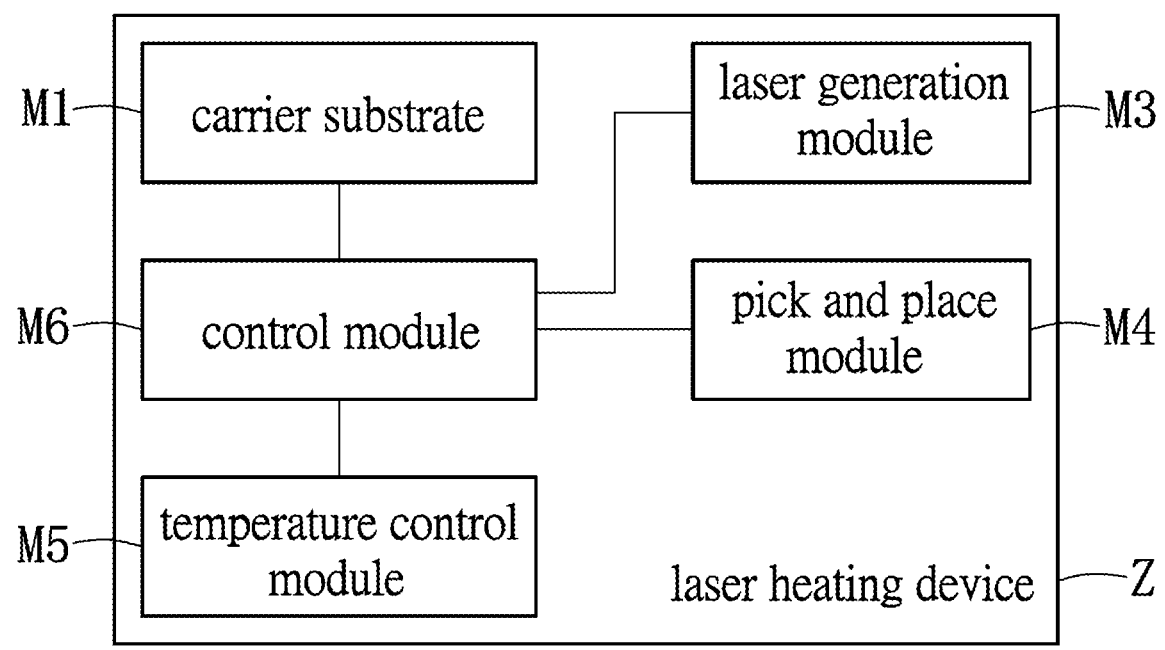
FIG. 14 illustrates a functional block diagram of the laser heating device for soldering electronic components according to some exemplary embodiments.

Referring to FIG. 13 to FIG. 14 together with FIG. 1 to FIG. 12, a third embodiment of the present disclosure provides a laser heating device Z for soldering electronic components. The laser heating device Z for soldering electronic components is similar to that described in the first embodiment, and therefore similar steps in the process will be omitted. Further, the difference between the third embodiment and the first embodiment is that the laser heating device Z for soldering electronic components further includes a temperature control module M5 and a control module M6. The temperature control module M5 is adjacent to the carrier substrate M1 for detecting the temperature of the conductor 101 to obtain a conductor temperature information. The control module M6 is electrically connected between the temperature control module M5 and the laser generation module M3. The control module M6 adjusts the power output by the laser generation module M3 according to the conductor temperature information.

For example, the temperature control module M5 may be a temperature sensor or a temperature controller. A sensing end of the temperature control module M5 may be disposed on the carrier substrate M1 and adjacent to the circuit substrate 10, or the sensing end of the temperature control module M5 may be located outside the carrier substrate M1 and adjacent to one or a part of the conductor 101 on the circuit substrate 10. Moreover, the control module M6 is electrically connected to the carrier substrate M1, the laser generation module M3, the pick and place module M4 and the temperature control module M5. Therefore, at the same time as or after the laser source L is projected onto the conductor 101 on the circuit substrate 10, the temperature of the conductor 101 can be detected by the temperature control module M5 to obtain conductor temperature information. Then, the control module M6 can determine whether the power output by the laser generation module M3 is sufficient, too low or too high according to the conductor temperature information (for example, comparing the conductor temperature information with a preset temperature information), and then the power output by the laser generation module M3 is appropriately adjusted. However, the above-mentioned example is only one of the possible embodiments.

It is worth mentioning that, as shown in FIG. 1 to FIG. 14, a laser heating device Z for soldering electronic components is further provided and includes a circuit substrate 10, an optical module M2, a laser generation module M3, a temperature control module M5 and a control module M6. The circuit substrate 10 is used to carry a plurality of conductors 101. The optical module M2 is disposed above the circuit substrate 10. The laser generation module M3 is adjacent to the optical module M2 to provide a laser source L with a first coverage R1. The temperature control module M5 is adjacent to the circuit substrate 10 for detecting the temperature of the conductor 101 to obtain a conductor temperature information. The control module M6 is electrically connected between the temperature control module M5 and the laser generation module M3. The first coverage R1 of the laser source L is optically adjusted by the optical module M2 to form a second coverage R2. The first coverage R1 is greater than, less than or equal to the second coverage R2, and the first coverage R1 and the second coverage R2 have the same or different shapes. The control module M6 adjusts the power output by the laser generation module M3 according to the conductor temperature information.

Figure 15:
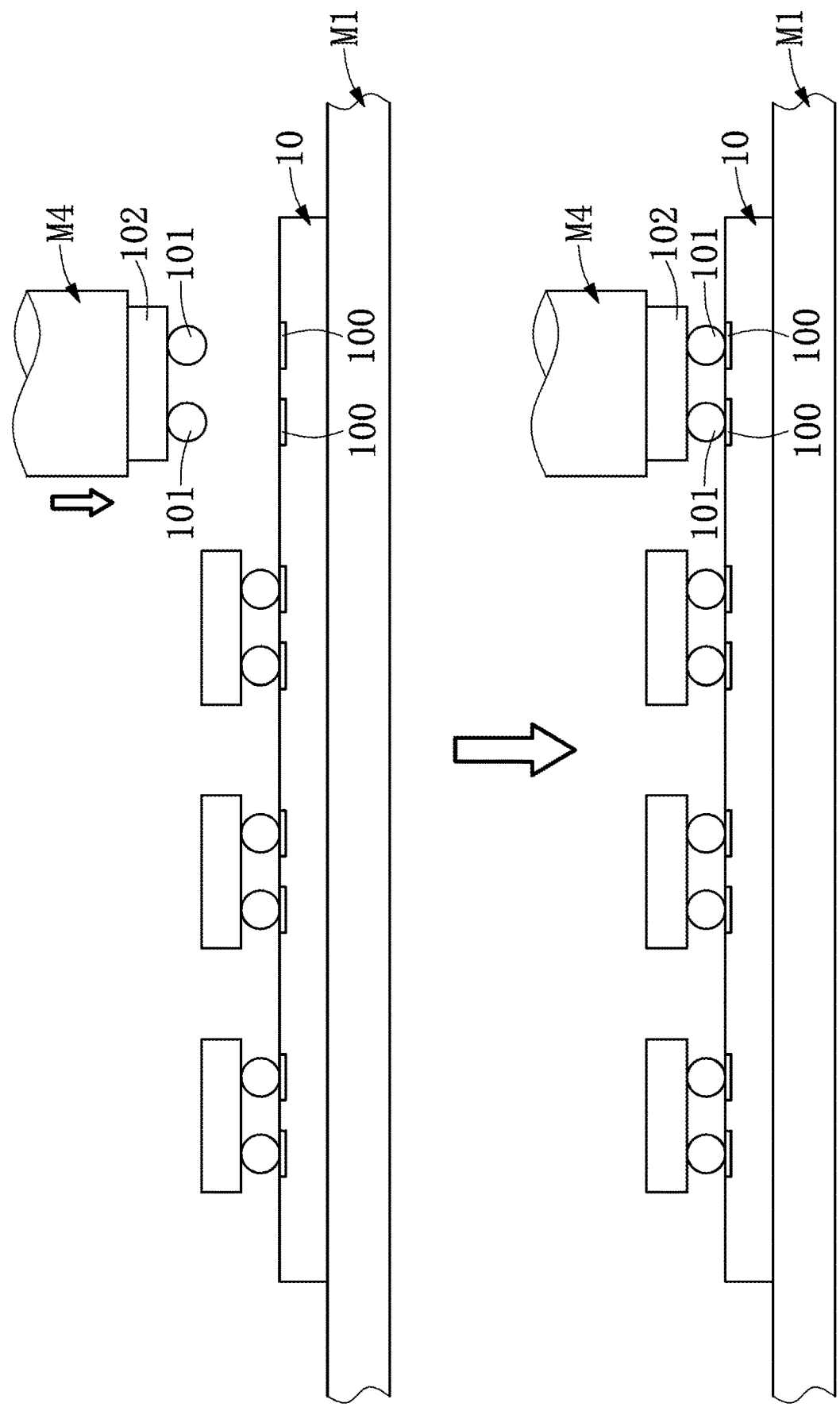
FIG. 15 illustrates a first operational schematic diagram of a laser heating device for soldering electronic components according to some exemplary embodiments.
Figure 16:
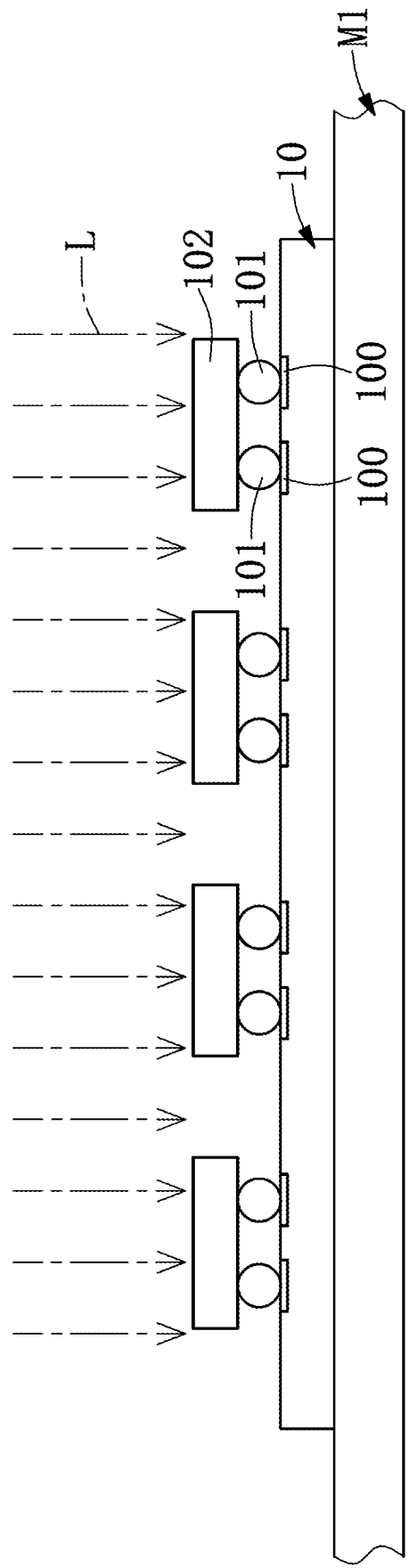
FIG. 16 illustrates a second operational schematic diagram of the laser heating device for soldering electronic components according to some exemplary embodiments.

Referring to FIG. 15 to FIG. 16 together with FIG. 1 to FIG. 14, a fourth embodiment of the present disclosure provides a laser heating device Z for soldering electronic components. The laser heating device Z for soldering electronic components is similar to that described in the first embodiment, and therefore similar steps in the process will be omitted. Further, according to FIGS. 2, 3 and 15, the difference between the fourth embodiment and the first embodiment is that the laser heating device Z for soldering electronic components may also have at least two conductors 101 disposed on each of the LED chips 102.

For example, at least two conductors 101 may be disposed on each of the LED chips 102, and the conductor 101 may be a solder ball or other conductive materials having different shapes or structures. Next, as shown in FIG. 15, a plurality of LED chips 102 are placed on the circuit substrate 10 by a pick and place module M4, and at least two conductors 101 of each of the LED chips 102 correspond to the conductive pads 100 of the circuit substrate 10. Then, the light from the laser source L generated by the laser generation module is directed to the LED chip 102. Next, when the conductor 101 disposed between the LED chip 102 and the circuit substrate 10 is irradiated by the laser source L, the conductor 101 is softened, and a connection with the circuit substrate 10 is made. Finally, after the conductor 101 is cured, the LED chip 102 is mounted onto the circuit substrate 10 and electrically connected to the circuit substrate 10 through the conductor 101. However, the above-mentioned example is only one of the possible embodiments.

While various aspects and embodiments have been disclosed herein, other aspects and embodiments will be apparent to those skilled in the art. The various aspects and embodiments disclosed herein are for purposes of illustration and are not intended to be limiting, with the true scope being indicated by the following claims, along with the full scope of equivalents to which such claims are entitled. It is also to be understood that the terminology used herein is for the purpose of describing particular embodiments only, and is not intended to be limiting.

What is claimed is:

1. A method for soldering electronic components, comprising:
   providing a circuit substrate;
   providing a plurality of electronic components;
   placing the plurality of electronic components onto the circuit substrate;
   applying a conductor between the plurality of electronic components and the circuit substrate;
   providing an energy source which projects an energy beam with a first coverage;
   enlarging the energy beam and projecting the energy beam onto the circuit substrate with a second coverage, wherein the second coverage is continuous to cover the plurality of electronic components and larger than the first coverage; and
   melting the conductor within the second coverage via the energy beam and fixing the corresponding electronic components on the circuit substrate through the melted conductor.

2. The method according to claim 1, wherein the energy source is a laser source.

3. The method according to claim 1, wherein the energy beam is enlarged by an optical lens.

4. The method according to claim 1, wherein the electronic components are LED chips.

5. A method for manufacturing a LED display, comprising using the method of claim 4 to solder the LED chips onto the circuit substrate.

* * * * *